US008852960B2

(12) United States Patent
Kim et al.

(10) Patent No.: US 8,852,960 B2
(45) Date of Patent: Oct. 7, 2014

(54) METHOD OF FABRICATING SEMICONDUCTOR DEVICE AND APPARATUS FOR FABRICATING THE SAME

(75) Inventors: Woojin Kim, Yongin-si (KR); Jangeun Lee, Suwon-si (KR); Sechung Oh, Suwon-si (KR); Junho Jeong, Suwon-si (KR); Heeju Shin, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 430 days.

(21) Appl. No.: 13/305,377

(22) Filed: Nov. 28, 2011

(65) Prior Publication Data

US 2012/0135544 A1    May 31, 2012

(30) Foreign Application Priority Data

Nov. 29, 2010 (KR) .................. 10-2010-0119903

(51) Int. Cl.
*H01L 21/00* (2006.01)
*H01L 27/22* (2006.01)
*C23C 16/46* (2006.01)
*C23C 16/40* (2006.01)
*H01L 43/10* (2006.01)
*C23C 16/455* (2006.01)
*C23C 16/34* (2006.01)

(52) U.S. Cl.
CPC ............ *C23C 16/345* (2013.01); *H01L 27/222* (2013.01); *C23C 16/46* (2013.01); *C23C 16/403* (2013.01); *H01L 43/10* (2013.01); *C23C 16/45536* (2013.01)
USPC ...................................... 438/3; 257/E21.665

(58) Field of Classification Search
CPC ....... H01L 27/222; H01L 29/82; H01L 27/22; H01L 43/04
USPC ........................................ 438/3; 257/E21.665
See application file for complete search history.

(56) References Cited

U.S. PATENT DOCUMENTS

| 5,695,864 | A | 12/1997 | Sloncezewski |
| 7,220,669 | B2 | 5/2007 | Hujanen et al. |
| 2008/0191251 | A1* | 8/2008 | Ranjan et al. ................. 257/295 |
| 2010/0103553 | A1* | 4/2010 | Shimazawa et al. ............ 360/59 |

(Continued)

FOREIGN PATENT DOCUMENTS

| KR | 10-0449645 | 7/2003 |
| KR | 10-0869326 | 7/2003 |
| KR | 10-2003-0002120 | 8/2003 |

OTHER PUBLICATIONS

English Abstract for Publication No. 10-2003-0063635 (for 10-0449645).

(Continued)

*Primary Examiner* — Jarrett Stark
(74) *Attorney, Agent, or Firm* — F. Chau & Associates, LLC

(57) ABSTRACT

Provided is a method of fabricating a semiconductor device. The method of fabricating a semiconductor device includes forming a plurality of magnetic memory patterns spaced apart from each other on a substrate, with each of the magnetic memory patterns including a free pattern, a tunnel barrier pattern, and a reference pattern which are stacked on the substrate, performing a magnetic thermal treatment process on the magnetic memory patterns, and forming a passivation layer on the magnetic memory patterns. The magnetic thermal treatment process and the forming of the passivation layer are simultaneously performed in one reactor.

15 Claims, 14 Drawing Sheets

(56) References Cited

U.S. PATENT DOCUMENTS

2010/0289098 A1* 11/2010 Li et al. .................. 257/421
2011/0121417 A1* 5/2011 Li et al. .................. 257/421
2012/0086089 A1* 4/2012 Li et al. .................. 257/421

OTHER PUBLICATIONS

English Abstract for Publication No. 10-2003-0002120.
English Abstract for Publication No. 10-2003-0064412 (for 10-0869326).

E.B. Myers et al., "Current-Induced Switching of Domains in Magnetic Multilayer Devices," Science 285, 867 (1999).

J.C. Slonczewski, "Current-Driven Excitation of Magnetic Multilayers", Journal of Magnetism and Magnetic Materials 159 (1996) L1-L7.

L. Berger, "Emission of Spin Waves by a Magnetic Multilayer Traversed by a Current," Physical Review B, vol. 54, No. 13, pp. 9353-9358 (1996).

\* cited by examiner

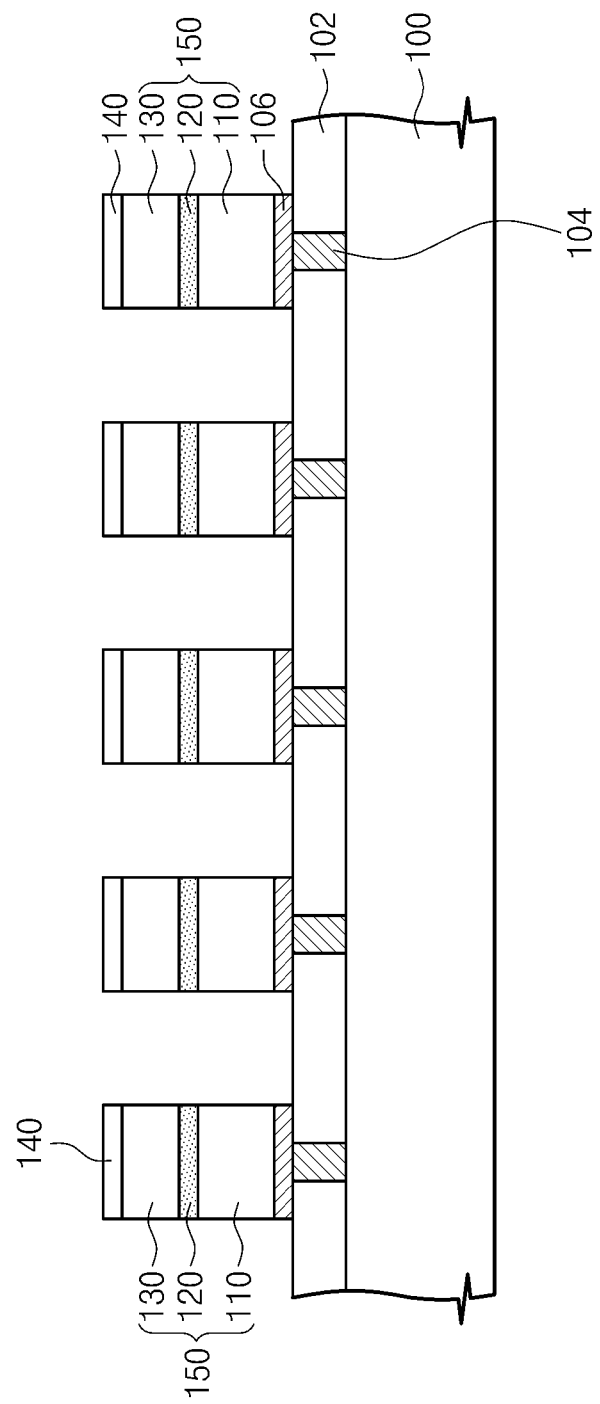

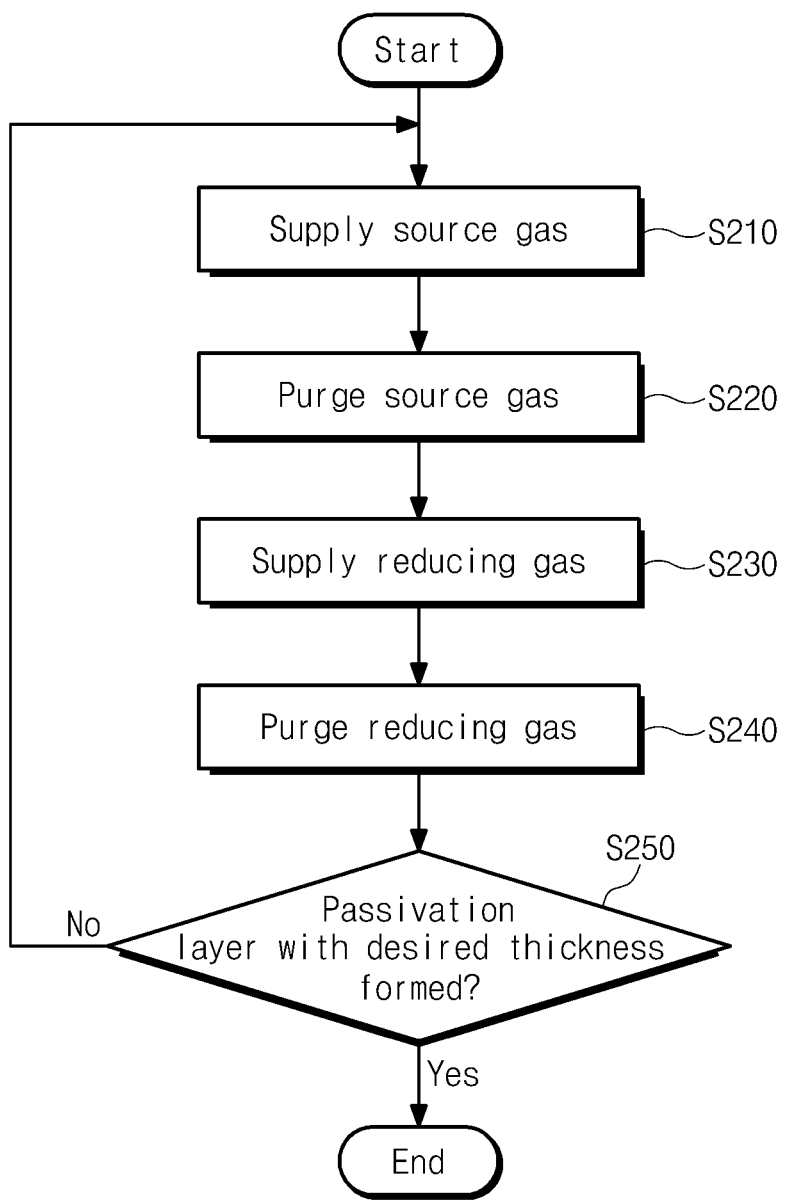

METHOD OF FABRICATING SEMICONDUCTOR DEVICE AND APPARATUS FOR FABRICATING THE SAME

CROSS-REFERENCE TO RELATED APPLICATIONS

This U.S. patent application claims priority under 35 U.S.C. §119 to Korean Patent Application No. 10-2010-0119903, filed on Nov. 29, 2010, the entire disclosure of which is hereby incorporated by reference herein in its entirety.

BACKGROUND

The present disclosure herein relates to a method of fabricating a semiconductor device and an apparatus for fabricating the same, and more particularly, to a method of fabricating a magnetic memory device and an apparatus for fabricating the same.

With electrical products now having even higher speeds and lower consumption power, semiconductor memory devices built therein may now also require faster write/read operations and lower operation voltages. To satisfy such needs, magnetic memory devices have been proposed for use as semiconductor memory devices. As magnetic memory devices can operate at high speeds and have non-volatile characteristics, they may become the next-generation memory device.

In general, magnetic memory devices may include a Magnetic Tunnel Junction (MTJ). The magnetic tunnel junction may include, for example, two magnetic materials and a tunnel barrier pattern interposed therebetween. The resistance value of a magnetic tunnel junction may depend on the magnetization directions of the two magnetic materials. For example, the magnetic tunnel junction may have a relatively high resistance value when the magnetization directions of the two magnetic materials are anti-parallel to each other, and have a relatively low resistance value when the magnetization directions of the two magnetic materials are parallel. Magnetic memory devices can write/read data using the difference between such resistance values.

SUMMARY

Exemplary embodiments of the inventive concept may provide a method of fabricating a semiconductor device with shortened fabrication time and an apparatus for fabricating the same.

Exemplary embodiments of the inventive concept may also provide a method of fabricating a semiconductor device and an apparatus for fabricating the same, which have high reliability.

Exemplary embodiments of the inventive concept may also provide a method of fabricating a semiconductor device and an apparatus for fabricating the same, which are optimized for high integration.

Exemplary embodiments of the inventive concept provide a method for fabricating a semiconductor device including: forming a plurality of magnetic memory patterns spaced apart from each other on a substrate, with each of the magnetic memory patterns including a free pattern, a tunnel barrier pattern, and a reference pattern which are stacked on the substrate, and performing a magnetic thermal treatment process on the magnetic memory patterns, and forming a passivation layer on the magnetic memory patterns, simultaneously in one reactor.

In exemplary embodiments of the inventive concept, magnetization directions of the free patterns included in the magnetic memory patterns may be aligned by the magnetic annealing process.

In exemplary embodiments of the inventive concept, the free patterns may be formed of a ferromagnetic material in an amorphous state, the reference patterns may include a pinned pattern foamed of a ferromagnetic material in an amorphous state, and the performing of the magnetic thermal treatment process may include crystallizing the free patterns and the pinned patterns by using the tunnel barrier pattern as a seed layer.

In exemplary embodiments of the inventive concept, [001] surface of the tunnel barrier patterns may be parallel to [001] surfaces of the free patterns and the pinned patterns.

In exemplary embodiments of the inventive concept, a magnetic field direction of the magnetic thermal treatment may be parallel to a top surface of the substrate.

In exemplary embodiments of the inventive concept, magnetization directions of the free patterns and reference patterns may be parallel to the top surface of the substrate.

In exemplary embodiments of the inventive concept, a magnetic field direction of the magnetic thermal treatment may be vertical to a top surface of the substrate.

In exemplary embodiments of the inventive concept, magnetization directions of the free patterns and reference patterns may be vertical to the top surface of the substrate.

In exemplary embodiments of the inventive concept, the passivation layer may be conformally formed on the magnetic memory patterns, and an empty space surrounded by the passivation layer may be defined between the magnetic memory patterns adjacent to each other.

In exemplary embodiments of the inventive concept, the passivation layer may completely fill gaps between the magnetic memory patterns adjacent to each other.

In exemplary embodiments of the inventive concept, the passivation layer may be formed in an atomic layer deposition (ALD) process.

In exemplary embodiments of the inventive concept, an apparatus for fabricating a semiconductor device includes: a reactor in which a substrate including a plurality of magnetic memory patterns is provided, a heater coil surrounding the reactor and adapted to supply heat to the magnetic memory patterns, a magnetic field generator surrounding the heater coil and adapted to supply a magnetic field to the magnetic memory pattern and a gas inlet adapted to supply a reactive gas into the reactor for forming a passivation layer on the magnetic memory patterns.

In exemplary embodiments of the inventive concept, the apparatus for fabricating a semiconductor device may further include a gas outlet purging the reactive gas, and the forming the passivation layer may include: supplying source gas through the gas inlet, purging the source gas to the gas outlet and supplying reducing gas through the gas inlet to react the reducing gas with the source gas.

In exemplary embodiments of the inventive concept, while the heater coil and the magnetic field generator supply the heat and magnetic field to the magnetic memory patterns, the source gas and the reducing gas may be supplied.

In exemplary embodiments of the inventive concept, while the heater coil supplies the heat to the magnetic memory patterns, the magnetic field generator may supply the magnetic field to the magnetic memory patterns.

In exemplary embodiments of the inventive concept, a method for fabricating a semiconductor device includes forming a first interlayer dielectric on the substrate, fanning a lower contact plug in the first interlayer dielectric, forming a lower electrode on the first interlayer dielectric and contacting the lower contact plug, and forming a plurality of magnetic memory patterns spaced apart from each other on the substrate. Each of the magnetic memory patterns include a free pattern, a tunnel barrier pattern, and a reference pattern which are stacked on the first interlayer dielectric. The method further includes forming a plurality of capping patterns on the magnetic memory patterns, performing a magnetic thermal treatment process on the magnetic memory patterns, and forming a passivation layer on the magnetic memory patterns, simultaneously in one reactor; and forming a second interlayer dielectric on the passivation layer.

BRIEF DESCRIPTION OF THE DRAWINGS

The accompanying drawings are included to provide a further understanding of exemplary embodiments of the inventive concept, and are incorporated in and constitute a part of this specification. The drawings illustrate exemplary embodiments of the inventive concept and, together with the description, serve to explain principles of exemplary embodiments of the inventive concept. In the drawings:

FIGS. 2A to 2C are sectional views illustrating a method of fabricating a semiconductor device according to an exemplary embodiment of the inventive concept;

FIG. 3 is a flowchart illustrating a method of forming a passivation layer in a method of fabricating a semiconductor device according to an exemplary embodiment of the inventive concept;

DETAILED DESCRIPTION OF EXEMPLARY EMBODIMENTS

Figure 1:
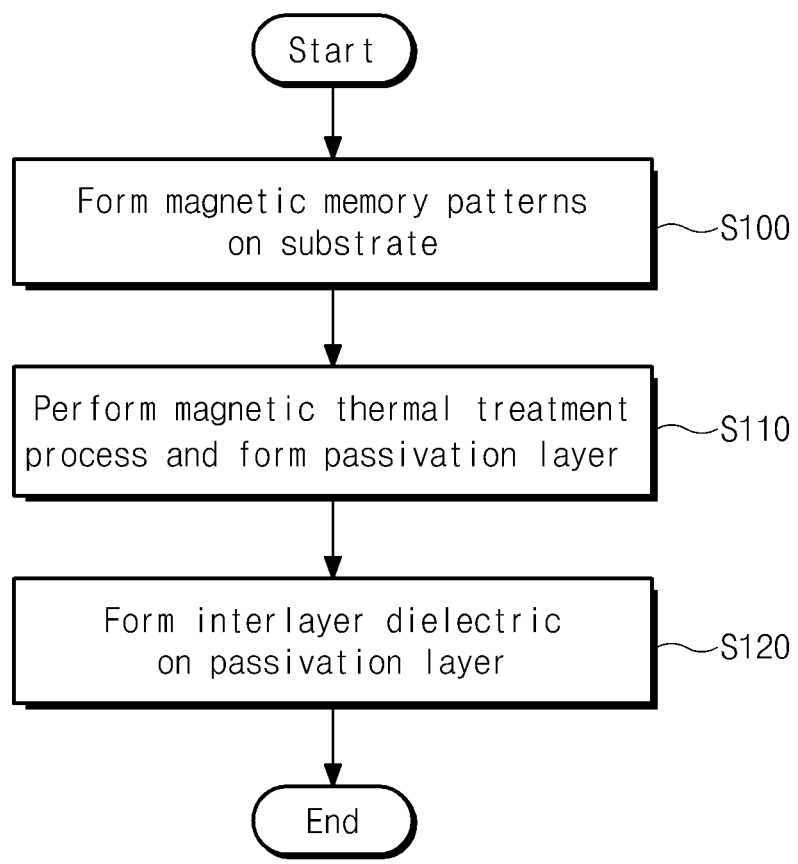
FIG. 1 is a flowchart illustrating a method of fabricating a semiconductor device according to an exemplary embodiment of the inventive concept.

Exemplary embodiments of the inventive concept will be described below in more detail with reference to the accompanying drawings. The inventive concept may, however, be embodied in different forms and should not be construed as limited to exemplary embodiments set forth herein.

In the specification, it will be understood that when a layer (or film) is referred to as being 'on' another layer or substrate, it can be directly on the other layer or substrate, or intervening layers may also be present. As used herein, the term and/or includes any and all combinations of one or more of the associated listed items. Like reference numerals refer to like elements throughout.

Hereinafter, exemplary embodiments of the inventive concept will be described in detail with reference to the accompanying drawings.

Figure 2B:
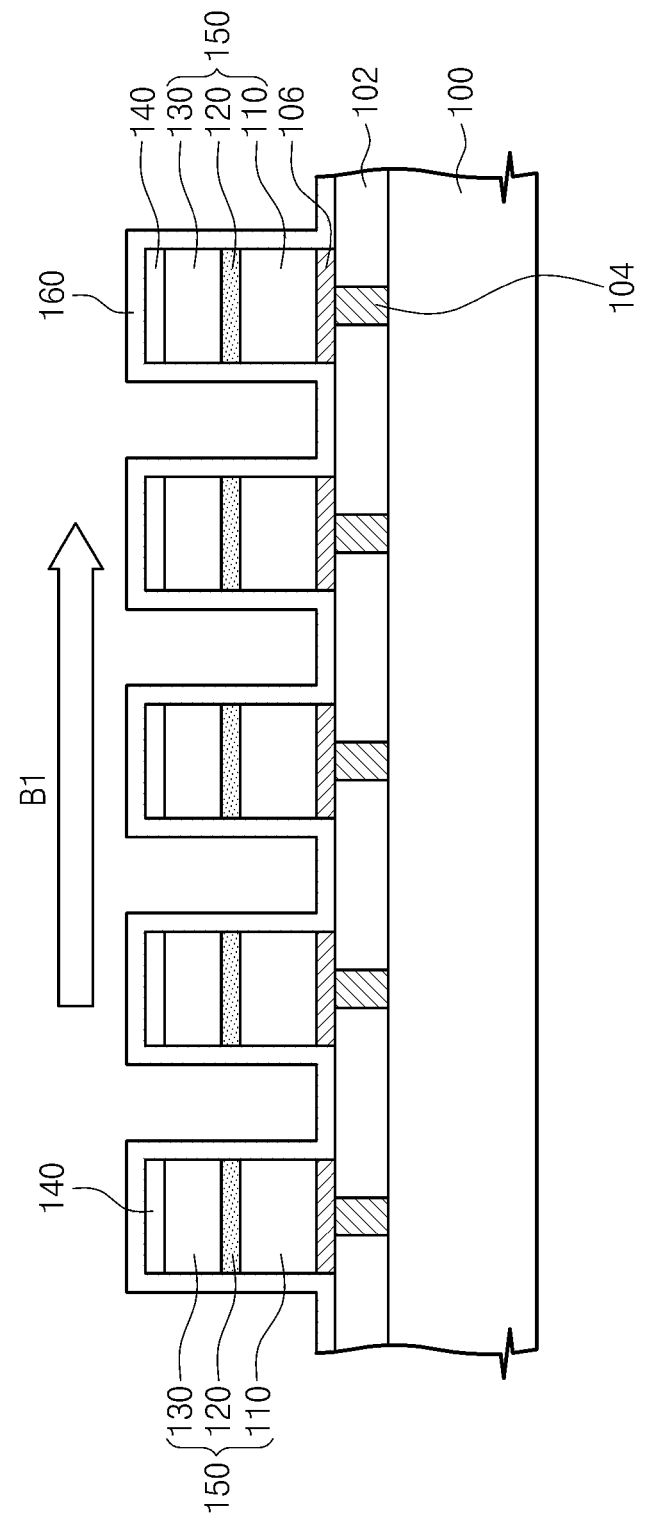
Figure 2C:
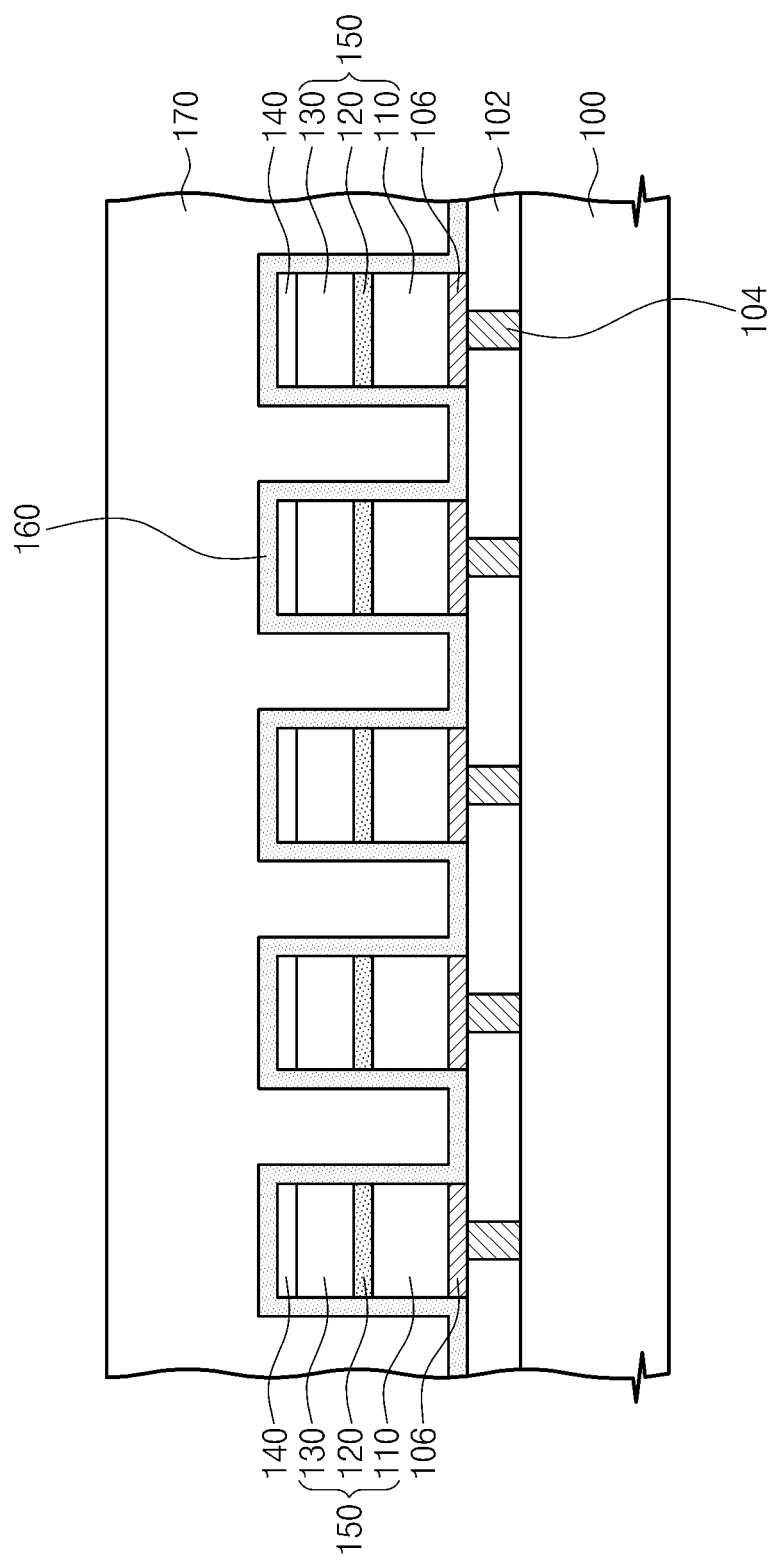

FIG. 1 is a flowchart illustrating a method of fabricating a semiconductor device according to an exemplary embodiment of the inventive concept. FIGS. 2A to 2C are sectional views illustrating a method of fabricating a semiconductor device according to an exemplary embodiment of the inventive concept.

Referring to FIGS. 1 and 2A, a switching unit may be disposed on a substrate 100. The switching unit may be, for example, a field-effect transistor or diode. A first interlayer dielectric 102 may be disposed over the substrate 100. The first interlayer dielectric 102 may be disposed on the switching unit. A lower contact plug 104 may be disposed in a lower contact hole passing through the first interlayer dielectric 102. The lower contact plug 104 may be electrically connected with one terminal of the switching unit. According to an exemplary embodiment, when the switching unit is a diode, at least a portion of the switching unit may fill a lower region of the lower contact hole. In this case, the lower contact plug 104 may fill an upper region of the lower contact hole.

The substrate 100 may be, for example, a silicon substrate, germanium substrate, or silicon-germanium substrate. The first interlayer dielectric 102 may include, for example, an oxide, nitride, and/or oxynitride. The lower contact plug 104 may include a semiconductor which is doped by a dopant (for example, doped silicon), metal (for example, tungsten, copper, or aluminum), conductive metal nitride (for example, titanium nitride, or tantalum nitride), transition metal (for example, titanium or tantalum), and/or metal-semiconductor compound (for example, metal silicide).

In operation S100, a plurality of magnetic memory patterns 150 may be formed on the substrate 100. The magnetic memory patterns 150 may be disposed on the substrate 100 to be spaced apart from each other, and thus gap regions may be defined between the magnetic memory patterns 150 adjacent to each other. Intervals between the gap regions are uniform. For example, the gap regions may have a interval of about 30 nm therebetween.

Each of the magnetic memory patterns 150 may include, for example, a reference pattern 110, free pattern 130, and tunnel barrier pattern 120 disposed between the reference pattern 110 and the free pattern 130. The reference pattern 110 may have a magnetization direction fixed to one direction. A magnetization direction of the free patterns 130 may be configured to be changed to a direction parallel or antiparallel to the magnetization direction of the reference patterns 110.

According to an exemplary embodiment of the inventive concept, the reference patterns 110, the tunnel barrier patterns 120, and the free patterns 130 may be sequentially stacked on the first interlayer dielectric 102. However, unlike as illustrated in FIG. 2, the free patterns 130, the tunnel barrier patterns 120, and the reference patterns 110 may instead be sequentially stacked on the first interlayer dielectric 102. For convenience, the case in which the reference patterns 110, the tunnel barrier patterns 120, and the free patterns 130 are sequentially stacked on the substrate 100 will be described in connection with the present exemplary embodiment.

A lower electrode 106 may be disposed between the magnetic memory patterns 150 and the first interlayer dielectric 102. The lower electrode 106 may contact with the lower contact plug 104. The lower electrode 106 may include a conductive material with low reactivity. As an example, the lower electrode 106 may include conductive metal nitride (for example, titanium nitride, tantalum nitride, or tungsten nitride).

Capping patterns 140 may be disposed on the magnetic memory patterns 150. The capping patterns 140 may be formed of, for example, at least one of tantalum (Ta), aluminum (Al), copper (Cu), gold (Au), silver (Ag), titanium (Ti), tantalum nitride (TaN), and titanium nitride (TiN).

The lower electrode 106, the magnetic memory patterns 150, and the capping patterns 140 may be formed by, for example, sequentially forming a lower electrode layer, pinning layer, tunnel barrier layer, free layer, and capping layer and sequentially patterning the capping layer, free layer, tunnel barrier layer, pinning layer, and lower electrode layer.

Referring to FIGS. 1 and 2B, in operation S110, a magnetic thermal treatment process may be performed on the magnetic memory patterns 150, and a passivation layer 160 may be formed on the substrate 100. The magnetic thermal treatment process may be, for example, performed in one reactor simultaneously with the forming of the passivation layer 160.

The passivation layer 160 may be formed, for example, to conformally cover the magnetic memory patterns 150. Therefore, empty spaces may be defined in the gap regions between the magnetic memory patterns 150 adjacent to each other. For example, the passivation layer 160 may include silicon nitride or aluminum oxide. The passivation layer 160 may have a thickness of, for example, about 5 nm to about 10 nm.

When the gap regions between the magnetic memory patterns 150 adjacent to each other have a width of about 30 nm, and a passivation layer 160 covering the magnetic memory patterns 150 is formed in a chemical vapor deposition (CVD) process, the gap regions may be narrow, and thus the passivation layer 160 formed in the chemical vapor deposition process may not conformally cover the magnetic memory patterns 150. Thus, the passivation layer 160 may be formed in an atomic layer deposition (ALD) process. A method of forming the passivation layer 160 will be further described with reference to FIG. 3.

FIG. 3 is a flowchart illustrating a method of forming a passivation layer in a method of fabricating a semiconductor device according to an exemplary embodiment of the inventive concept.

Referring to FIG. 3, in operation 5210, a source gas may be supplied into the reactor to which the substrate 100 having the magnetic memory patterns 150 has been provided. The source gas is supplied, and thus a reactive layer conformally covering the magnetic memory patterns 150 may be formed. In operation 5220, the remaining source gas may be purged without the reactive layer being formed. In operation 5230, a reducing gas may be supplied into the reactor. The supplied reducing gas may be reacted with the reactive layer to form the passivation layer 160. For example, an element included in the reducing gas may be substituted for an element included in the reactive layer. In operation S240, the remaining reducing gas may be purged without the reactive layer being reacted. Byproduct gas, which is formed through the reaction between the reducing gas and the reactive layer, may also be purged together. In operation 5250, whether the passivation layer 160 having a desired thickness has been formed is determined, and then operations S210 to 5240 described above may be repeated.

For example, when the passivation layer 160 is formed of aluminum oxide, the source gas may include at least one of triisobutyl aluminum, dimethyl aluminum hybrid, trimethyl aluminum, or dimethyethyl-amine alane. In this case, the reducing gas may include, for example, at least one of zinc gas, copper gas, tungsten gas, gas with hydrogen (—H) being a reductor, titanium tetrachloride, tungsten hexafluoride, or copper chloride.

For example, when the passivation layer 160 is formed of silicon nitride, the silicon source gas may include at least one of silicon tetrachloride, dichlorosilane, or hexachlorodisilane. In this case, the reducing gas may include at least one of, for example, ammonia or hydrazine.

Referring again to FIGS. 1 and 2B, according to an exemplary embodiment of the inventive concept, a magnetic field direction B1 of the magnetic thermal treatment process may be, for example, parallel to the top surface of the substrate 100. In this case, magnetization directions of the free patterns 130 and reference patterns 110 included in the magnetic memory patterns 150 may be, for example, parallel to the top surface of the substrate 100. When a program current flows in the magnetic memory patterns 150a, the direction in which the program current flows may perpendicularly intersect the magnetization directions of the free patterns 130 and reference patterns 110.

While the magnetic thermal treatment process is performed, the magnetic field direction B1 may remain the same. The magnetization direction of the free patterns 130 included in the magnetic memory patterns 150 may be aligned in one direction through the magnetic thermal treatment process. For example, the magnetization direction of the free patterns 130 may be aligned to be parallel to the magnetic field direction B1 of the magnetic thermal treatment process. Therefore, the magnetization direction of the free patterns 130 may be parallel to the top surface of the substrate 100.

Ferromagnetic material layers included in the reference patterns 110 and free patterns 130 may be crystallized through, for example, a magnetic annealing process. It will be described with reference to FIG. 4.

Figure 4:
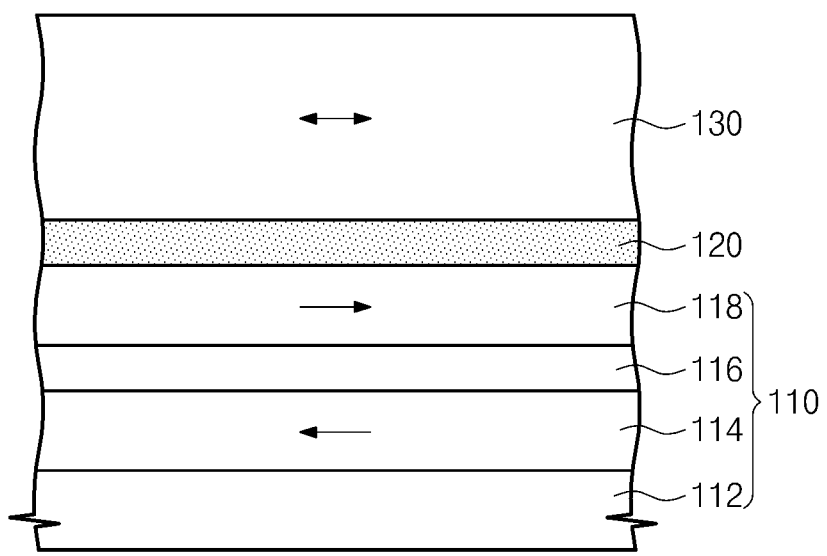
FIG. 4 is an enlarged view illustrating a magnetic memory pattern included in a semiconductor device according to an exemplary embodiment of the inventive concept.

FIG. 4 is an enlarged view of the magnetic memory patterns 150 described with reference to FIG. 2A, for illustrating magnetic memory patterns included in a semiconductor device according to an exemplary embodiment of the inventive concept.

Referring to FIG. 4, the reference patterns 110 may include, for example, a pinning pattern 112 and a main pinned pattern 118 disposed between the pinning pattern 112 and the tunnel barrier pattern 120. The reference patterns 110 may further include, for example, an assistant pinned pattern 114 and an exchange coupling pattern 116. The assistant pinned patterns 114 may be disposed between the pinning patterns 112 and the main pinned patterns 118. The exchange coupling patterns 116 may be disposed between the main pinned patterns 118 and the assistant pinned patterns 114.

The magnetization direction of the assistant pinned patterns 114 may be fixed by the pinning patterns 112. The exchange coupling patterns 116 may couple the assistant pinned patterns 114 and main pinned patterns 118 such that the magnetization direction of the main pinned patterns 118 is, for example, anti-parallel to that of the assistant pinned patterns 114. Accordingly, the magnetization direction of the main pinned patterns 118 may be fixed in one direction by the pinning patterns 112, assistant pinned patterns 114, and exchange coupling patterns 116. The main pinned patterns 118 are adjacent to the tunnel barrier patterns 120. Thus, the magnetization direction of the main pinned patterns 118 correspond to the fixed magnetization direction of the reference patterns 110 of the magnetic memory patterns 150.

According to an exemplary embodiment of the inventive concept, the assistant pinned patterns 114 and exchange coupling patterns 116 may be omitted, and the main pinned patterns 118 may directly contact with the pinning patterns 112.

The pinning patterns 112 may include, for example, an anti-ferromagnetic material. For example, the pinning patterns 112 may include at least one of platinum-manganese (PtMn), iridium-manganese (IrMn), manganese oxide (MnO), manganese sulfate (MnS), manganese-tellurium (MnTe), or manganese fluoride (MnF).

The main pinned patterns 118 may include, for example, a ferromagnetic material. For example, the main pinned patterns 118 may include at least one of cobalt-iron-boron (CoFeB), cobalt-iron (CoFe), nickel-iron (NiFe), cobalt-iron-platinum (CoFePt), cobalt-iron-palladium (CoFePd), cobalt-iron-chromium (CoFeCr), cobalt-iron-terbium (CoFeTb), or cobalt-iron-nickel (CoFeNi).

The assistant pinned patterns 114 may include, for example, a ferromagnetic material. For example, the assistant pinned patterns 114 may include at least one of cobalt-iron-boron (CoFeB), cobalt-iron (CoFe), nickel-iron (NiFe), cobalt-iron-platinum (CoFePt), cobalt-iron-palladium (CoFePd), cobalt-iron-chromium (CoFeCr), cobalt-iron-terbium (CoFeTb), or cobalt-iron-nickel (CoFeNi). The exchange coupling patterns 116 may include, for example, at least one of ruthenium (Ru), iridium (Ir), or Rhodium (Rh).

The free patterns 130 may include, for example, a ferromagnetic material. For example, the free patterns 130 may include the same material as the main pinned patterns 118.

The tunnel barrier patterns 120 may have, for example, a thickness less than a spin diffusion distance. The tunnel barrier patterns 120 may include, for example, a dielectric material. For example, the tunnel barrier patterns 120 may include at least one of magnesium oxide, titanium oxide, aluminum oxide, magnesium-zinc oxide, or magnesium-boron oxide.

For example, the main pinned patterns 118 and the free patterns 130 may contact with the tunnel barrier patterns 120 and be formed of a ferromagnetic material in an amorphous state. In this case, the main pinned patterns 118 and the free patterns 130 may be, for example, crystallized using the tunnel barrier patterns 120 as a seed layer through the magnetic thermal treatment process. For example, when the tunnel barrier patterns 120 include magnesium oxide (MgO), and the main pinned patterns 118 and free patterns 130 include cobalt-iron-boron (CoFeB), the main pinned patterns 118 and free patterns 130 may be crystallized such that [001] surfaces of the main pinned patterns 118 and free patterns 130 are parallel to [001] surface of the tunnel barrier patterns 120. Therefore, the main pinned patterns 118, tunnel barrier patterns 120, and free patterns 130 may have the same lattice structure. As a result of the above-mentioned lattice structure of the main pinned patterns 118, tunnel barrier patterns 120, and free patterns 130 being the same as one another, carriers (electrons or holes) may readily move between the main pinned patterns 118 and free patterns 130 through the tunnel barrier patterns 120, and thus a magnetic resistance ratio of a magnetic memory cell can be increased. Accordingly, a semiconductor device with high reliability may be implemented.

As described above, the magnetic annealing process and the passivation layer forming process are simultaneously performed in the reactor. Therefore, process time and fabrication time of a semiconductor device are shortened, compared with a case in which the magnetic thermal treatment process and the passivation layer forming process are separately performed, thereby increasing a production amount of a semiconductor device.

Referring to FIGS. 1 and 2C, in operation S120, a second interlayer dielectric 170 may be formed on the substrate 100 after the magnetic thermal treatment process and the passivation layer forming process. The second interlayer dielectric 170 may fill the empty spaces surrounded by the passivation layer 160 in the gap regions. The second interlayer dielectric 170 may be formed of, for example, silicon oxide or silicon nitride. The second interlayer dielectric 170 may be formed in a chemical vapor deposition process. In this case, the second interlayer dielectric 170 may not completely fill the space surrounded by the passivation layer 160 in the gap regions and may include a void and/or seam formed in the gap regions.

The operating method of the magnetic memory pattern described above will be further described hereinafter. The magnetization direction of the free pattern 130 may be changed by a spin transfer torque of electrons in the program current passing through the magnetic memory pattern. At this point, the free patterns 130 may serve as an element storing logical data. For example, when the magnetization direction of the free patterns 130 is anti-parallel to that of the reference patterns 110, a program current may be supplied from the free patterns 130 to the reference patterns 110. That is, electrons in the program current may be supplied from the reference patterns 110 to the free patterns 130. The electrons in the program current may include major electrons and minor electrons. The major electrons may have spins parallel to the magnetization direction of the reference patterns 110. The minor electrons may have spins anti-parallel to the magnetization direction of the reference patterns 110. The major electrons are accumulated in the free patterns 130, and a spin torque of the accumulated major electrons may change the magnetization direction of the free patterns 130 to be parallel to the magnetization direction of the reference patterns 110.

Unlike this, when the magnetization direction of the free patterns 130 is parallel to that of the reference patterns 110, the program current may be supplied from the reference patterns 110 to the free patterns 130. That is, the electrons in the program current may be supplied from the free patterns 130 to the reference patterns 110. The minor electrons anti-parallel to the magnetization direction of the reference patterns 110 among the electrons in the program current may be reflected due to the magnetization direction of the reference patterns 110. The reflected minor electrons may be accumulated in the free patterns 130. A spin torque of the accumulated minor electrons may change the magnetization direction of the free patterns 130 to be anti-parallel to the magnetization direction of the reference patterns 110.

In an exemplary embodiment of the inventive concept above, the magnetic field direction B1 of the magnetic thermal treatment is parallel to the top of the substrate 100. Unlike this, the magnetic field direction B1 of the magnetic thermal treatment may be vertical to the top of the substrate 100. It will be described with reference to FIGS. 5 and 6.

A method of fabricating a semiconductor device according to an exemplary embodiment of the inventive concept will be described.

Figure 5:
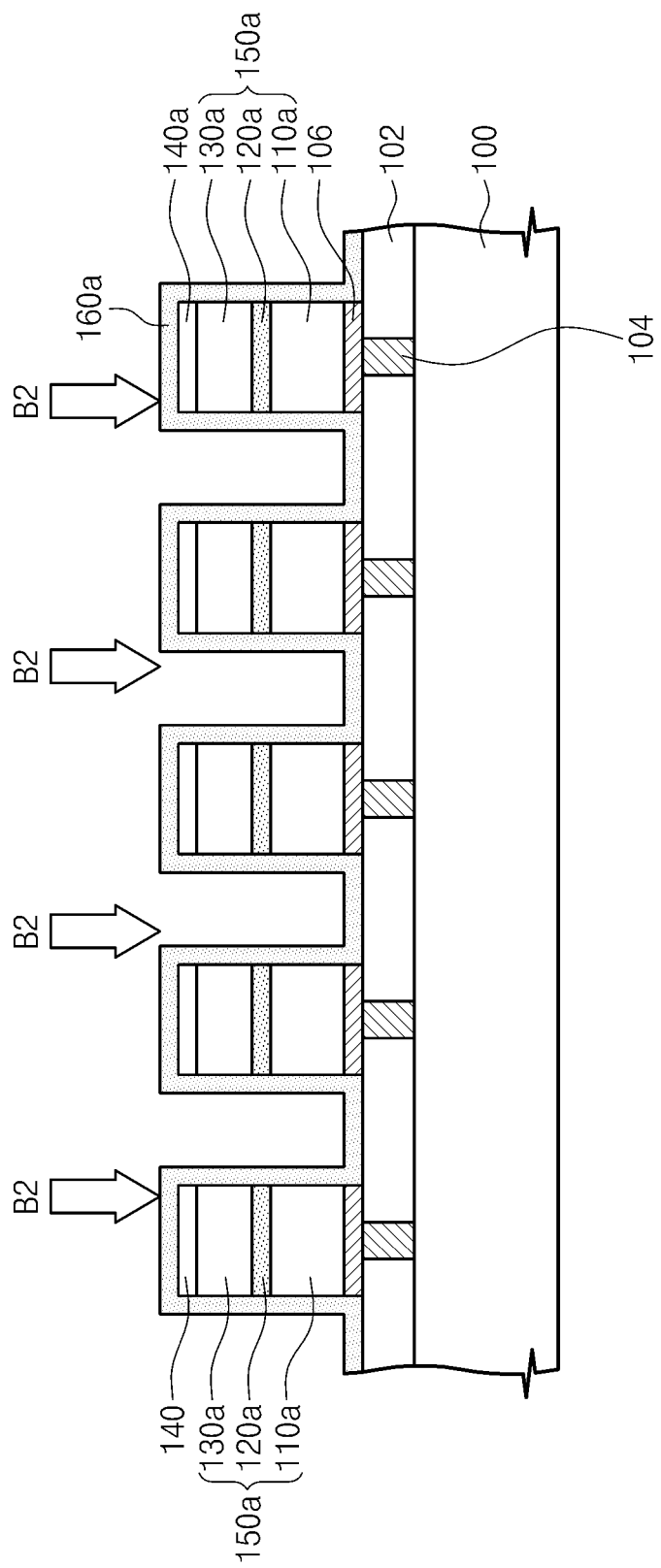
FIG. 5 is a sectional view illustrating a method of fabricating a semiconductor device according to an exemplary embodiment of the inventive concept.
Figure 6:
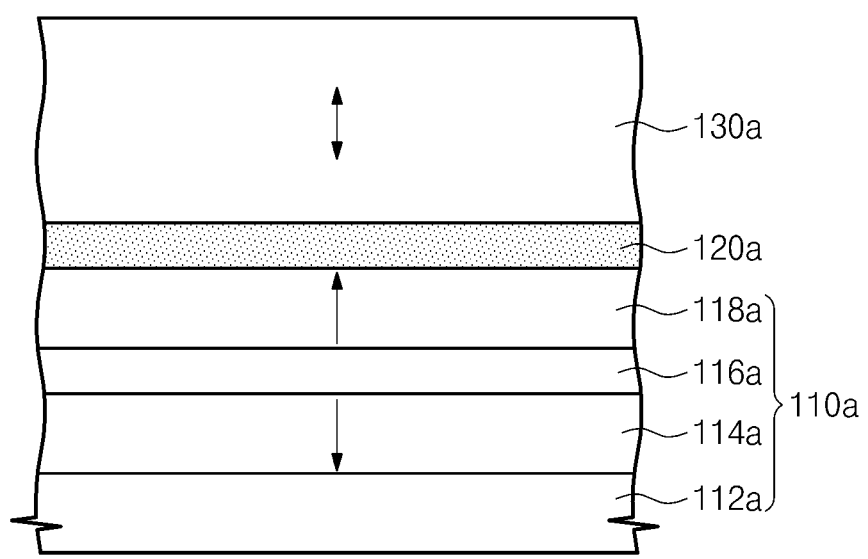
FIG. 6 is an enlarged view illustrating a magnetic memory pattern included in a semiconductor device according to an exemplary embodiment of the inventive concept.

FIG. 5 is a sectional view illustrating a method of fabricating a semiconductor device according to an exemplary embodiment of the inventive concept. FIG. 6 is an enlarged view of the magnetic memory patterns 150a of FIG. 5, for illustrating magnetic memory patterns included in a semiconductor device according to an exemplary embodiment of the inventive concept.

Referring to FIGS. 5 and 6, the substrate 100, first interlayer dielectric 102, lower contact plug 104, and lower electrode 106 described with reference to FIGS. 1, 2a, 2b, and 2c may be provided.

A plurality of magnetic memory patterns 150a may be formed on the first interlayer dielectric 102. The lower electrode 106 may be disposed between the magnetic memory patterns 150a and the lower contact plug 104. The magnetic memory patterns 150a may be disposed to be spaced apart from each other, and thus gap regions may be defined between the magnetic memory patterns 150a adjacent to each other. The magnetic memory patterns 150a may each include, for example, a reference pattern 110a, free pattern 130a, and tunnel barrier pattern 120a disposed between the reference pattern 110a and the free pattern 130a. The reference patterns 110a may have a magnetization direction fixed to one direction. A magnetization direction of the free patterns 130a may be configured to be changed to a direction parallel or anti-parallel to the magnetization direction of the reference patterns 110a.

A magnetic thermal treatment process may be, for example, performed on the magnetic memory patterns 150a, and simultaneously a passivation layer 160a covering the magnetic memory patterns 150a on the substrate 100 may be formed. As described with reference to FIG. 4, the passivation layer 160a may be formed in an atomic layer deposition (ALD) process to conformally cover the magnetic memory patterns 150a.

According to an exemplary embodiment of the inventive concept, the magnetic field direction B2 of the magnetic thermal treatment process may be, for example, vertical to the top surface of the substrate 100. In this case, the magnetization directions of the free patterns 130a and reference patterns 110a included in the magnetic memory patterns 150a may be, for example, vertical to the top surface of the substrate 100. When a program current flows in the magnetic memory patterns 150a, the direction in which the program current flows may be parallel or anti-parallel to the magnetization directions of the free patterns 130a and pinning patterns 110a.

While the magnetic thermal treatment process is performed, the magnetic field direction B2 may remain the same. The magnetization direction of the free patterns 130a included in the magnetic memory patterns 150a may be aligned in one direction through the magnetic thermal treatment process. For example, the magnetization direction of the free patterns 130a may be aligned to be parallel to the magnetic field direction B2 of the magnetic thermal treatment process. Therefore, the magnetization direction of the free patterns 130a may be, for example, vertical to the top surface of the substrate 100.

The free patterns 130a may include, for example, a ferromagnetic material described with reference to FIG. 4. The tunnel barrier patterns 120a may include, for example, the same material as the tunnel barrier patterns 120 described with reference to FIG. 4.

The reference patterns 110a may include, for example, a pinning pattern 112a and a main pinned pattern 118a disposed between the pinning pattern 112a and tunnel barrier pattern 120a. The reference patterns 110a may further include, for example, an assistant pinned pattern 114a and an exchange coupling pattern 116a. The assistant pinned patterns 114a may be disposed between the pinning patterns 112a and main pinned patterns 118a. The exchange coupling patterns 116a may be disposed between the main pinned patterns 118a and the assistant pinned patterns 114a.

The magnetization direction of the assistant pinned patterns 114a may be fixed by the pinning patterns 112a. The exchange coupling patterns 116a may couple the assistant pinned patterns 114a and main pinned patterns 118a such that the magnetization direction of the main pinned patterns 118a is, for example, anti-parallel to that of the assistant pinned patterns 114a. Accordingly, the magnetization direction of the main pinned patterns 118a may be fixed in one direction by the pinning patterns 112a, assistant pinned patterns 114a, and exchange coupling patterns 116a.

The pinning patterns 112a may be formed of, for example, an anti-ferromagnetic material. The assistant pinned patterns 114a and main pinned patterns 118a may be formed of, for example, a ferromagnetic material. The exchange coupling patterns 116a may include, for example, the same material as the exchange coupling patterns 116 described with reference to FIGS. 2B and 4.

The main pinned patterns 118a and free patterns 130a which are contacted with the tunnel barrier patterns 120a may include, for example, a ferromagnetic material in an amorphous state. In this case, the main pinned patterns 118a and free patterns 130a may be, for example, crystallized using the tunnel barrier patterns 120a as a seed layer through the magnetic thermal treatment process.

Subsequently, as described with reference to FIG. 2C, the second interlayer dielectric 170 may be formed on the passivation layer 160 and magnetic memory patterns 150a.

In exemplary embodiments of the inventive concept described above, a passivation layer conformally covers magnetic memory patterns. Unlike this, the passivation layer may completely fill gap regions between the magnetic memory patterns adjacent to each other. It will be described with reference to FIG. 7.

A method of fabricating a semiconductor device according to an exemplary embodiment of the inventive concept will be described.

Figure 7:
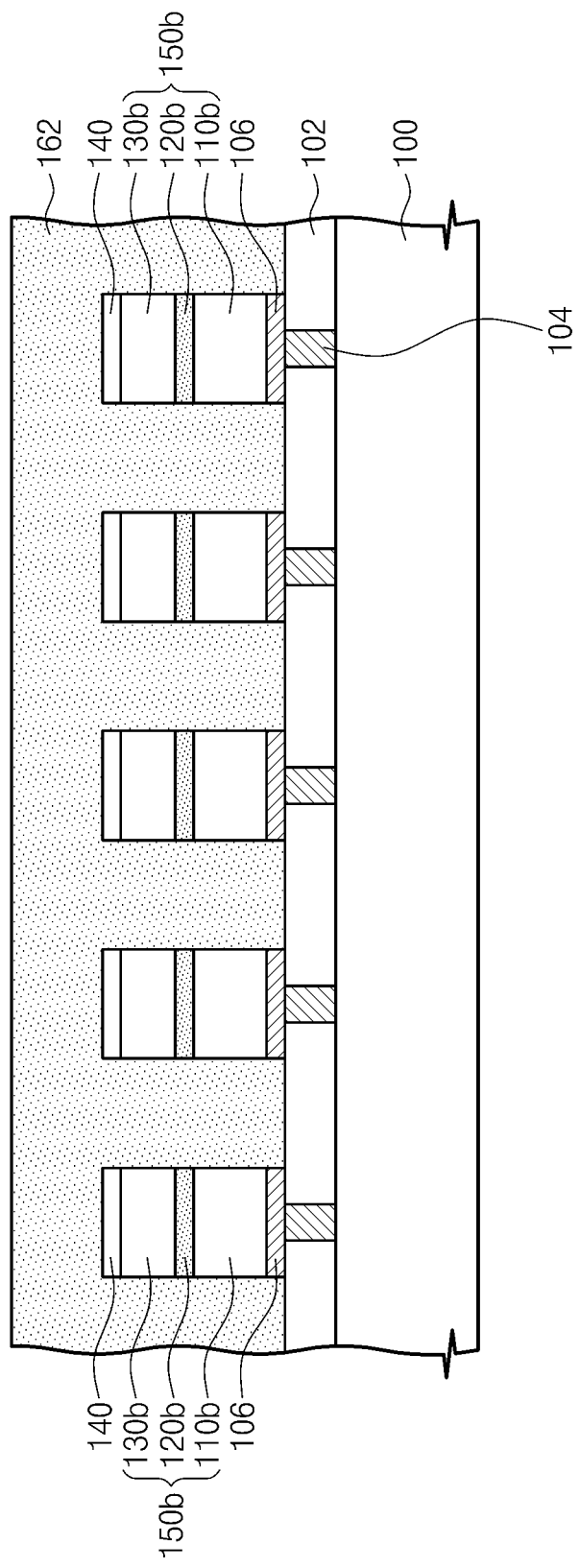
FIG. 7 is a sectional view illustrating a method of fabricating a semiconductor device according to an exemplary embodiment of the inventive concept.

FIG. 7 is a sectional view illustrating a method of fabricating a semiconductor device according to an exemplary embodiment of the inventive concept.

Referring to FIG. 7, the substrate 100, first interlayer dielectric 102, lower contact plug 104, and lower electrode 106 described with reference to FIGS. 1, 2A, 2B, and 2C may be provided.

Magnetic memory patterns 150b may be formed. The magnetic memory patterns 150b may include, for example, a reference pattern 110b, tunnel barrier pattern 120b, and free pattern 130b stacked on the first interlayer dielectric 102. The lower electrode 106 may be disposed between the magnetic memory patterns 150b and the lower contact plug 104. Gap regions may be defined between the magnetic memory patterns 150b adjacent to each other. The magnetic memory patterns 150b may be the magnetic memory patterns 150 described with reference to FIGS. 2a and 4. Unlike this, the magnetic memory patterns 150b may be the magnetic memory patterns 150a with reference to FIGS. 5 and 6.

A magnetic thermal treatment process may be performed on the magnetic memory patterns 150b, and a passivation layer 162 may be formed on the substrate 100. The magnetic thermal treatment process may be performed, for example, in one reactor simultaneously with the forming of the passivation layer 162. As described with reference to FIG. 2a, the magnetic direction of the magnetic thermal treatment process may be parallel to the top surface of the substrate 100. Unlike this, as described with reference to FIG. 5, the magnetic direction of the magnetic thermal treatment process may be vertical to the top surface of the substrate 100.

The passivation layer 162 may completely fill the gap regions. The passivation layer 162 may be formed, for example, in the atomic layer deposition (ALD) process as described with reference to FIG. 3. Therefore, the gap regions may be stably filled with the passivation layer 162 without void and/or seam.

An apparatus for fabricating a semiconductor device according to an exemplary embodiment of the inventive concept will be described.

Figure 8A:
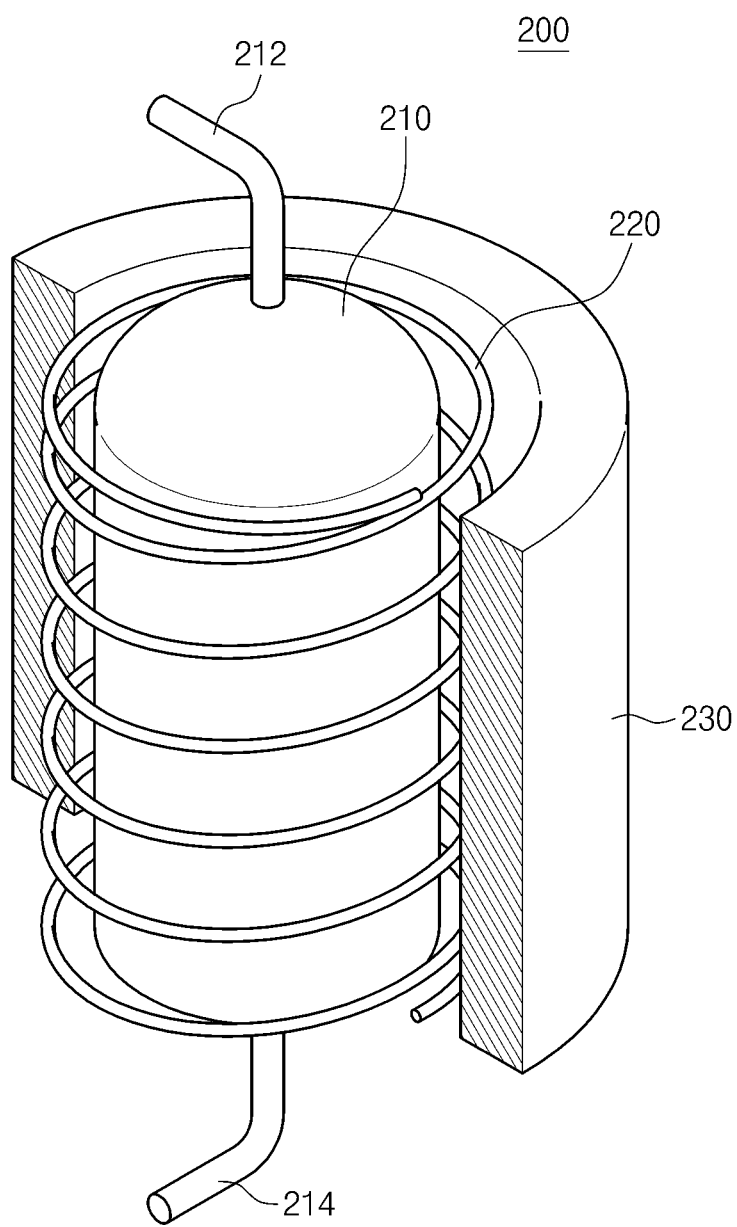
FIG. 8A is a perspective view illustrating an apparatus for fabricating a semiconductor device according to an exemplary embodiment of the inventive concept.
Figure 8B:
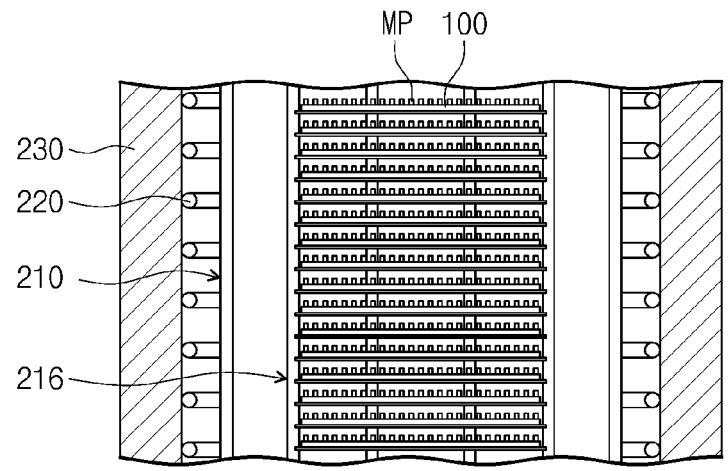
FIGS. 8B and 8C are sectional views illustrating the provision of substrates in a reactor according to an exemplary embodiment of the inventive concept.
Figure 8C:
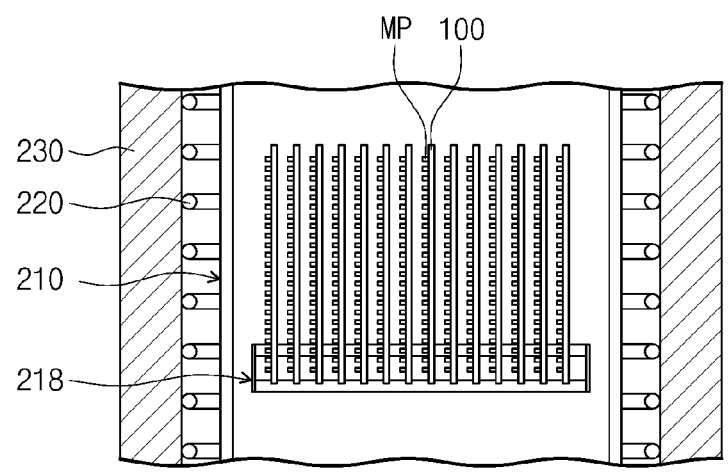

FIG. 8A is a perspective view illustrating an apparatus for fabricating a semiconductor device according to an example embodiment of the inventive concept. For convenience, a portion of a magnetic field generator to be described below is omitted. FIGS. 8B and 8C are sectional views of an apparatus for fabricating a semiconductor device according to an exemplary embodiment of the inventive concept, for illustrating the provision of substrates in a reactor according to exemplary embodiments of the inventive concept.

Referring to FIGS. 8A, 8B, and 8C, an apparatus 200 for fabricating a semiconductor device according to an exemplary embodiment of the inventive concept may include, for example, a reactor 210, heater coil 220 surrounding the reactor 210, magnetic field generator 230 surrounding the heater coil 220, gas inlet 212, and gas outlet 214.

The reactor 210 may include, for example, a substrate 100 including magnetic memory patterns MP. The magnetic memory patterns MP may be magnetic memory patterns according to exemplary embodiments of the inventive concept described with reference to FIG. 2A or 5. A plurality of substrates 100 may be provided in the reactor 210. The substrates 100 may be disposed to be parallel to each other. According to an exemplary embodiment of the inventive concept, as described in FIG. 8B, the substrates 100 may be fixed by a support 216 to be provided in the reactor 210 such that the tops of the substrates 100 are parallel to the earth's surface. Unlike this, according to an exemplary embodiment of the inventive concept, as described in FIG. 8C, the substrates 100 may be fixed by a support 218 to be disposed such that the tops of the substrates 100 provided in the reactor 210 are vertical to the earth's surface.

The heater coil 220 may supply heat to the magnetic memory patterns MP formed on the substrates 100. For example, the heater coil 220 may supply heat of about 200° C. to about 400° C. to the magnetic memory patterns MP. As described with reference to FIGS. 4 and 6, when the free patterns and reference patterns of the magnetic memory patterns MP include a ferromagnetic material in an amorphous state, the ferromagnetic material in an amorphous state may be crystallized using the tunnel barrier patterns as a seed pattern, by the heat supplied from the heater coil 220.

The magnetic field generator 230 may supply magnetic field to the magnetic memory patterns MP. The magnetic flux density of the magnetic field supplied from the magnetic field generator 230 may be, for example, about 10,000 G. According to an exemplary embodiment of the inventive concept, the magnetic field direction may be, for example, vertical to the top of the substrate 100. Unlike this, the magnetic field direction may be, for example, parallel to the top of the substrate 100. The magnetic field generator 230 may include, for example, at least one of a permanent magnet, electromagnet, and superconductive magnet. As described with reference to FIGS. 4 and 6, when the magnetic memory patterns MP include free patterns, the magnetization direction of the free patterns may be aligned in one direction by the magnetic field generated in the magnetic field generator 230.

While the heater coil 220 supplies heat to the magnetic memory patterns MP, the magnetic field generator 230 may supply magnetic field to the magnetic memory patterns MP. Therefore, the magnetic thermal treatment described with reference to FIGS. 2B, 5 and 7 may be performed in the magnetic memory patterns MP.

Source gas and reducing gas for forming a passivation layer on the magnetic memory patterns MP may be supplied into the reactor 210 through the gas inlet 212. The passivation layer may be, for example, the passivation layer described with reference to one of FIGS. 2B, 5, and 7. The source gas and the reducing gas may be, for example, the source gas and the reducing gas described with reference to FIG. 3. The source gas and reducing gas may be emitted outside the reactor 210 through the gas outlet 214.

The passivation layer may be formed, for example, in an atomic layer deposition (ALD) process through reaction of the source gas and reducing gas. For example, the source gas may be supplied into the reactor 210, in which the substrates 100 having the magnetic memory patterns MP have been provided, through the gas inlet 212. The source gas may be supplied, and thus a reactive layer conformally covering the magnetic memory patterns MP may be formed. The remaining source gas may be emitted outside the reactor 210 through the gas outlet 214 without the reactive layer being formed. The reducing gas may be supplied into the reactor 210 through the gas inlet 212. The supplied reducing gas may be reacted with the reactive layer to form the passivation layer. The remaining reducing gas may be emitted outside the reactor 210 through the gas outlet 214 without the reactive layer being reacted. Also, byproduct gas, which is formed through the reaction between the reducing gas and the reactive layer, may also be emitted through the gas outlet 214.

While the heater coil 220 and the magnetic field generator 230 supply heat and a magnetic field to the magnetic memory patterns MP, the source and reducing gases may be injected into the reactor 210 through the gas inlet 212 and emitted outside the reactor 210 through the gas outlet 214. Therefore, a process of forming the passivation layer, a process of supplying heat to the magnetic memory patterns MP, and a process of applying magnetic field to the magnetic memory patterns MP may be, for example, simultaneously performed in the reactor 210.

A period for which the heater coil 220 and magnetic field generator 230 simultaneously operate may be included. It will be described with reference to FIGS. 9A and 9B.

Figure 9A:
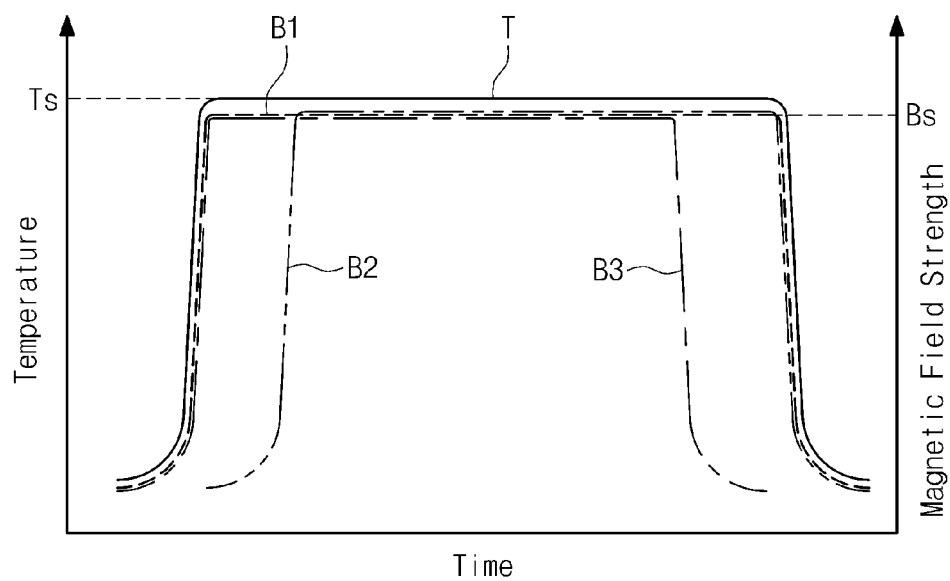
FIGS. 9A and 9B are graphs showing operation time of a heater coil and magnetic field generator included in an apparatus of fabricating a semiconductor device according to an exemplary embodiment of the inventive concept.
Figure 9B:
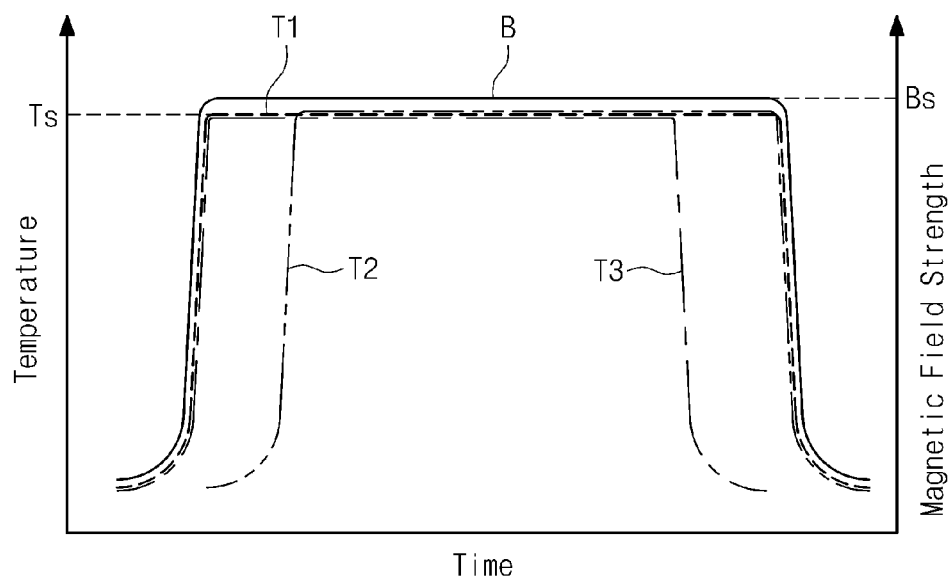

FIGS. 9A and 9B are graphs showing operation time of a heater coil and magnetic field generator included in an apparatus of fabricating a semiconductor device according to an exemplary embodiment of the inventive concept.

Referring to FIGS. 8A and 9A, the horizontal axis indicates time, the left vertical axis indicates temperature, and the right vertical axis indicates the magnetic field strength. In FIG. 9A, T indicates temperature change over time, and B1, B2, and B3 indicate the changes in magnetic field strength over time. The heater coil 220 may supply heat of reference temperature Ts to the magnetic memory patterns. The magnetic field generator 230 may supply reference magnetic field Bs to the magnetic memory patterns. According to B1, operation start time and operation end time of the heater coil 220 may be the same as those of the magnetic field generator 230. Therefore, the heater coil 220 and magnetic field generator 230 may have the same operation time. According to B2, operation start time of the magnetic field generator 230 may be slower than that of the heater coil 220, and operation end time of the magnetic field generator 230 may be the same as that of the heater coil 220. According to B3, operation start time of the magnetic field generator 230 may be the same as that of the heater coil 220, and operation end time of the magnetic field generator 230 may be faster than that of the heater coil 220. According to B2 and B3, operation time of the magnetic field generator 230 may be shorter than that of the heater coil 220.

Referring to FIGS. 8A and 9B, the horizontal axis indicates time, the left vertical axis indicates temperature, and the right vertical axis indicates the magnetic field strength. In FIG. 9B, B indicates the change in magnetic field strength over time, and T1, T2, and T3 indicate temperature changes over time. The heater coil 220 may supply heat of reference temperature Ts to the magnetic memory patterns. The magnetic field generator 230 may supply reference magnetic field Bs to the magnetic memory patterns. According to T1, operation start time and operation end time of the heater coil 220 may be the same as those of the magnetic field generator 230. Therefore, the heater coil 220 and magnetic field generator 230 may have the same operation time. According to T2, operation start time of the heater coil 220 may be slower than that of the magnetic field generator 230, and operation end time of the heater coil 220 may be the same as that of the magnetic field generator 230. According to T3, operation start time of the heater coil 220 may be the same as that of the magnetic field generator 230, and operation end time of the heater coil 220 may be faster than that of the magnetic field generator 230.

In exemplary embodiments described above, the disclosed magnetic memory devices may be implemented in various types of semiconductor packages. For example, a magnetic memory devices according to exemplary embodiments of the inventive concept may be packaged in a type such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin small Outline (TSOP), Thin Quad Flatpack (TQFP), System In Package (SIP), Multi Chip Package (MCP), Wafer-level Fabricated Package (WFP), and Wafer-Level Processed Stack Package (WSP).

A package on which a magnetic memory device is mounted according to exemplary embodiments of the inventive concept may further include, for example, a controller and/or logical device controlling the magnetic memory device.

Figure 10:
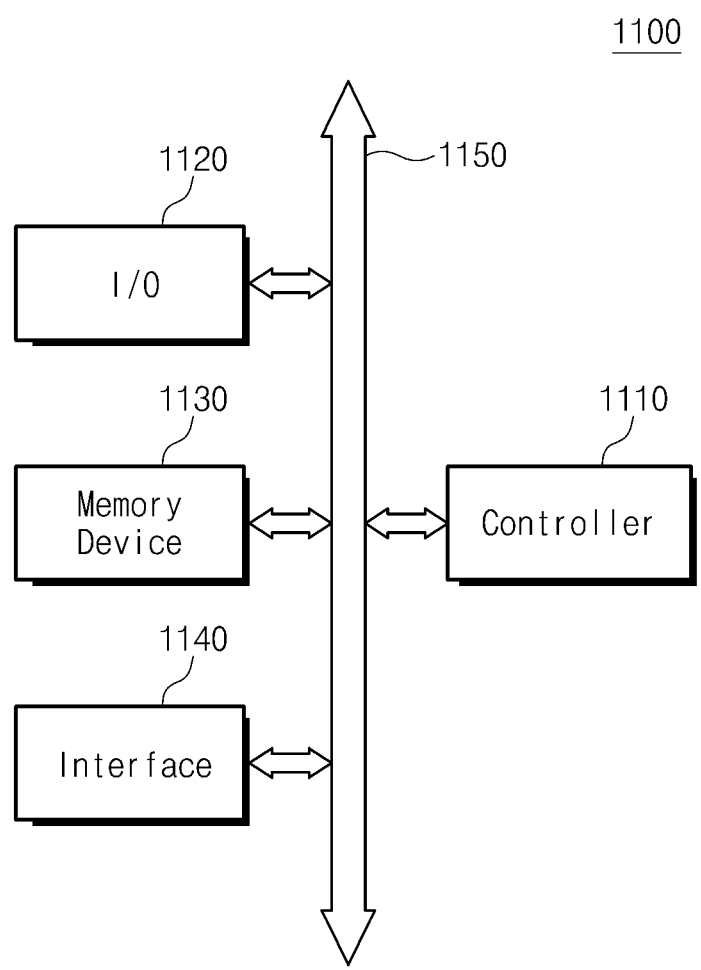
FIG. 10 is a block diagram illustrating an example of an electronic system including a magnetic memory device based on an exemplary embodiment of the inventive concept.

FIG. 10 is a block diagram illustrating an example of an electronic system including a magnetic memory device based on an exemplary embodiment of the inventive concept.

Referring to FIG. 10, an electronic system 1100 according to an exemplary embodiment of the inventive concept may include, for example, a controller 1110, input/output (I/O) device 1120, memory device 1130, interface 1140, and bus 1150. The controller 1110, I/O device 1120, memory device 1130, and/or interface 1140 are coupled through the bus 1150. The bus 1150 may be a path for transferring data.

The controller 1110 may include, for example, at least one of a microprocessor, digital signal processor, and microcontroller, and logical devices for performing the same function thereof. The input/output device 1120 may include, for example, a key pad, key board, and display device. The memory device 1130 may store data and/or commands. The memory device 1130 may include, for example, at least one of the magnetic memory devices disclosed in the above described exemplary embodiments of the inventive concept. Also, the memory device 1130 may further include another type of semiconductor memory device (for example, flash memory device, and/or phase-change memory device. The interface 1140 may perform a function of transmitting/receiving data to/from a communication network. The interface 1140 may be wired or wireless. For example, the interface 1140 may include an antenna or wired/wireless transceiver.

However, the electronic system 1100 may further include, for example, a high-speed dynamic random access memory (DRAM) device and/or static random access memory (SRAM) device as an operation memory device for enhancing operation of the controller 1110.

The electronic system 1100 may be applied to, for example, a personal digital assistant (PDA), portable computer, web tablet, wireless phone, mobile phone, digital music player, memory card, or all electronic products for transmitting/receiving information in a wireless environment.

Figure 11:
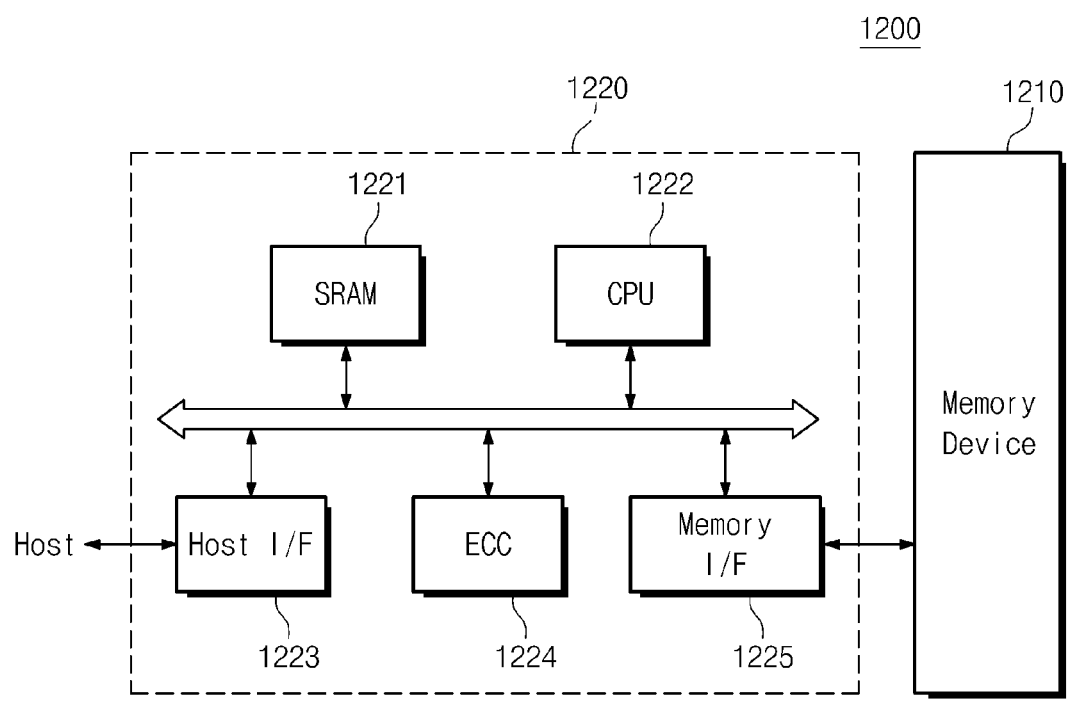
FIG. 11 is a block diagram illustrating an example of a memory card including a magnetic memory device based on an exemplary embodiment of the inventive concept.

FIG. 11 is a block diagram illustrating an example of a memory card including a magnetic memory device based on an exemplary embodiment of the inventive concept.

Referring to FIG. 11, a memory card 1200 according to an exemplary embodiment of the inventive concept includes, for example, a memory device 1210. The memory device 1210 may include, for example, at least one of the magnetic memory devices disclosed in the above described exemplary embodiments. Also, the memory device 1210 may further include another type of semiconductor memory device (for example, flash memory device, phase-change memory device, DRAM device, and/or SRAM device). The memory card 1200 may include, for example, a memory controller controlling data exchange between a host and the memory device 1210.

The memory controller 1220 may include, for example, a central processing unit (CPU) 1222 controlling the entire operation of the memory card. Also, the memory controller 1220 may include, for example, an SRAM 1221 used as an operation memory of the CPU 1222. In addition, the memory controller 1220 may further include, for example, a host interface 1223 and a memory interface 1225. The host interface 1223 may include a data exchange protocol between the memory card 1200 and the host. The memory interface 1225 may connect the memory controller 1220 and the memory device 1210. The memory controller 1220 may further include, for example, an error correction block (Ecc) 1224. The error correction block 1224 may detect and correct an error of data read from the memory device 1210. The memory card 1200 may further include, for example, a read only memory (ROM) device (not shown) storing code data for interfacing with the host. The memory card 1200 may be used as, for example, a portable data storage card. Unlike this, the memory card 1200 may also be implemented with, for example, a Solid State Disk (SSD) substitutable for a hard disk in a computer system.

According to exemplary embodiments of the inventive concept, the magnetic memory patterns may be formed on the substrate. A magnetic thermal treatment process for the magnetic memory patterns and the passivation layer forming process for covering the magnetic memory patterns may be simultaneously performed in one reactor. Therefore, the fabrication time of the semiconductor device can be shortened, and a semiconductor device with high reliability can be implemented.

Having described exemplary embodiments of the inventive concept, it is further noted that it is readily apparent to those of reasonable skill in the art that various modifications may be made without departing from the spirit and scope of the invention which is defined by the metes and bounds of the appended claims.

What is claimed is:

1. A method for fabricating a semiconductor device, the method comprising:
forming a plurality of magnetic memory patterns spaced apart from each other on a substrate, wherein each of the magnetic memory patterns comprising a free pattern, a tunnel barrier pattern, and a reference pattern which are stacked on the substrate; and performing a magnetic thermal treatment process on the magnetic memory patterns, and forming a passivation layer on the magnetic memory patterns, simultaneously in one reactor.

2. The method of claim 1, wherein magnetization directions of the free patterns comprised in the magnetic memory patterns are aligned by the magnetic thermal treatment process.

3. The method of claim 1, wherein,
the free patterns are formed of a ferromagnetic material in an amorphous state,
the reference patterns comprise a pinned pattern formed of a ferromagnetic material in an amorphous state, and
the performing of the magnetic thermal treatment process comprises crystallizing the free patterns and the pinned patterns by using the tunnel barrier patterns as a seed layer.

4. The method of claim 3, wherein [001] surface of the tunnel barrier patterns are parallel to [001] surfaces of the free patterns and the pinned patterns.

5. The method of claim 1, wherein a magnetic field direction of the magnetic thermal treatment is parallel to a top surface of the substrate.

6. The method of claim 5, wherein magnetization directions of the free patterns and the reference patterns are parallel to the top surface of the substrate.

7. The method of claim 1, wherein a magnetic field direction of the magnetic thermal treatment is vertical to a top surface of the substrate.

8. The method of claim 7, wherein magnetization directions of the free patterns and reference patterns are vertical to the top surface of the substrate.

9. The method of claim 1, wherein the passivation layer is conformally formed on the magnetic memory patterns, and an empty space surrounded by the passivation layer is defined between the magnetic memory patterns adjacent to each other.

10. The method of claim 1, wherein the passivation layer completely fills gaps between the magnetic memory patterns adjacent to each other.

11. The method of claim 1, wherein the passivation layer is formed in an atomic layer deposition (ALD) process.

12. The method of claim 1, wherein the forming of the passivation layer comprises:
supplying a source gas into the one reactor;
purging the source gas; and
supplying a reducing gas into the one reactor to react the reducing gas with the source gas.

13. The method of claim 1, wherein heat and a magnetic field are supplied simultaneously to the magnetic memory patterns during the magnetic thermal treatment process.

14. The method of claim 13, wherein while the heat and the magnetic field are supplied to the magnetic memory patterns during the magnetic thermal treatment process on the magnetic memory patterns, a source gas and a reducing gas are supplied into the one reactor to form the passivation layer on the magnetic memory patterns such that the magnetic thermal treatment process and the forming of the passivation are simultaneously performed in the one reactor.

15. The method of claim 3, wherein the free patterns, the pinned patterns and the tunnel barrier patterns are formed to have a same lattice structure as each other.

* * * * *